US012770840B2

(12) United States Patent
Cho et al.

(10) Patent No.: US 12,770,840 B2
(45) Date of Patent: Oct. 20, 2026

(54) ELECTROSTATIC CHUCK ASSEMBLY

(71) Applicant: Applied Materials, Inc., Santa Clara, CA (US)

(72) Inventors: Jaeyong Cho, San Jose, CA (US); Rajinder Dhindsa, Pleasanton, CA (US); Daniel Sang Byun, Campbell, CA (US); Vladimir Knyazik, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 731 days.

(21) Appl. No.: 17/974,088

(22) Filed: Oct. 26, 2022

(65) Prior Publication Data

US 2024/0145220 A1 May 2, 2024

(51) Int. Cl.

*H01J 37/32* (2006.01)
*H10P 72/72* (2026.01)

(52) U.S. Cl.

CPC . *H01J 37/32724* (2013.01); *H01J 2237/2001* (2013.01); *H01J 2237/2007* (2013.01); *H10P 72/722* (2026.01)

(58) Field of Classification Search

None

See application file for complete search history.

(56) References Cited

U.S. PATENT DOCUMENTS

| | | | |
|---|---|---|---|
| 10,957,572 B2 | 3/2021 | Parkhe | |
| 2007/0139856 A1* | 6/2007 | Holland | H01L 21/67103 361/234 |
| 2015/0113826 A1 | 4/2015 | Odagiri et al. | |
| 2018/0201545 A1 | 7/2018 | Nagatomo | |

(Continued)

FOREIGN PATENT DOCUMENTS

| | | | |
|---|---|---|---|
| TW | 202139346 | A | 10/2021 |
| TW | 202201467 | A | 1/2022 |
| WO | 2022086638 | A1 | 4/2022 |

OTHER PUBLICATIONS

Thermal conductivity table from Kyocera. https://global.kyocera.com/fcworld/charact/heat/thermalcond.html Printed on Jul. 10, 2025. (Year: 2025).*

International Search Report and Written Opinion for Application No. PCT/US2022/051872 dated Jul. 24, 2023.

Taiwanese Office Action for Application No. 112100024 dated Aug. 26, 2026.

* cited by examiner

*Primary Examiner* — Jeffrie R Lund
*Assistant Examiner* — Tiffany Z Nuckols
(74) *Attorney, Agent, or Firm* — Patterson + Sheridan, LLP

(57) ABSTRACT

Examples of a substrate support assembly are provided herein. In some examples, the substrate support assembly has a ceramic electrostatic chuck having a first side configured to support a substrate and a second side opposite the first side, wherein the ceramic electrostatic chuck includes an electrode embedded in the ceramic electrostatic chuck. The substrate support assembly has a cooling plate disposed under the second side of the ceramic electrostatic chuck, wherein the cooling plate includes an inner portion separated from an outer portion. The substrate support assembly has a bond layer coupling the ceramic electrostatic chuck to the cooling plate, wherein the bond layer is of a first material in the outer portion of the cooling plate and of a second material in the inner portion of the cooling plate, and wherein the first material has a greater thermal conductivity than that of the second material.

19 Claims, 5 Drawing Sheets

(56) References Cited

U.S. PATENT DOCUMENTS

| | | | | |
|---|---|---|---|---|
| 2018/0204757 | A1* | 7/2018 | Fushimi | H01J 37/32568 |
| 2021/0296098 | A1* | 9/2021 | Cho | H01L 21/6833 |
| 2021/0327741 | A1* | 10/2021 | Nagayama | H01L 21/3065 |

ELECTROSTATIC CHUCK ASSEMBLY

BACKGROUND

Field

Examples of the present disclosure generally relate to apparatus and methods for fabricating semiconductor devices. More specifically, apparatus disclosed herein relate to an electrostatic chuck assembly for used in a plasma processing chamber.

Background of the Related Art

Semiconductor substrates are processed for a wide variety of applications, including the fabrication of integrated devices and micro devices. One such processing device is a plasma processing chamber. During processing, the substrate is positioned on an electrostatic chuck assembly within the plasma processing chamber. The electrostatic chuck assembly may have an electrostatic chuck, a cooling base, a facility plate and/or a base. The electrostatic chuck (ESC) may have chucking electrodes for biasing the substrate to the electrostatic chuck.

A plasma is formed in the plasma processing chamber for processing the substrate. During plasma processing, tight controls over substrate temperature along with the shape of the plasma over the substrate are used to obtain good and consistent results. Temperature uniformity is provided by a plurality of heaters in the ESC along with a cooling base. The shape of the plasma is influenced by electrodes in the ESC as well as the shape of the ESC facing the plasma, i.e., process rings. Process skew may occur due to the plasma coupling to the ESC and/or non-uniformity of the temperature across the ESC, negatively impacting process performance.

In order to protect the ESC ceramic top surface, the ESC diameter is 2-4 mm smaller than the substrate diameter. Thus, the substrate overhangs the outside diameter of the ESC and causes the substrate edge temperature to increase. Conventionally there may be a separate or extended electrode underneath the edge ring to assist uniformity of the plasma sheath on the substrate edge. However, as a result of the extended electrode, additional heat from the plasma comes into the ESC through the edge ring and eventually causes substrate temperature roll up. The substrate edge temperature roll up due to the additional heat load from plasma processing results in non-uniformity and defects.

Therefore, there is a need for an improved electrostatic chuck assembly.

SUMMARY

Examples of a substrate support assembly are provided herein. In some examples, the substrate support assembly has a ceramic electrostatic chuck having a first side configured to support a substrate and a second side opposite the first side, wherein the ceramic electrostatic chuck includes an electrode embedded in the ceramic electrostatic chuck. The substrate support assembly has a cooling plate disposed under the second side of the ceramic electrostatic chuck, wherein the cooling plate includes an inner portion separated from an outer portion. The substrate support assembly has a bond layer coupling the ceramic electrostatic chuck to the cooling plate, wherein the bond layer is of a first material in the outer portion of the cooling plate and of a second material in the inner portion of the cooling plate, and wherein the first material has a greater thermal conductivity than that of the second material.

In another example, a processing chamber is provided. The processing chamber has a chamber body and a substrate support assembly disposed within an inner volume of the chamber body. The substrate support assembly has a ceramic electrostatic chuck having a first side configured to support a substrate and a second side opposite the first side, wherein the ceramic electrostatic chuck includes an electrode embedded in the ceramic electrostatic chuck. The substrate support assembly has a cooling plate disposed under the second side of the ceramic electrostatic chuck, wherein the cooling plate includes an inner portion separated from an outer portion. The substrate support assembly has a bond layer coupling the ceramic electrostatic chuck to the cooling plate, wherein the bond layer is of a first material in the outer portion of the cooling plate and of a second material in the inner portion of the cooling plate, and wherein the first material has a greater thermal conductivity than that of the second material.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

In the present disclosure, an electrostatic chuck assembly is provided which has an edge ring resting on a ceramic plate. The ceramic plate supports a substrate during plasma processing. The ceramic plate has separate chucking electrodes for cucking the substrate and the edge ring, a gas conduit for purge gas distribution, and multiple holes for the purge gas directed to a bottom surface of the edge ring. Voltage is applied to the chucking electrode creating an electrostatic force holding the edge ring in place against pressure of the backside gas provided to the bottom surface of the edge ring. The backside gas acts as a heat transfer medium between the edge ring and the ceramic plate. By controlling the pressure of the backside gas, the rate of heat transfer coefficient between the edge ring and the ceramic plate is controlled.

A cooling base may be coupled to a power source in effect making the cooling base an electrode. The cooling base may additionally have one or more separately cooling zones. In some examples, the cooling zones are separately controlled. The cooling zones may be arranged concentrically or in any other suitable manner. For example, an inner zone may be provided under the substrate support surface while an outer zone may be provided along the outer perimeter and possibly extending under the edge ring. The thermal break may be provided in the cooing base. The thermal break may be a slit or slot extending from an upper or lower surface partially through the cooling base. The thermal break may be filled with a material having a low thermal conductivity. The thermal break separates the cooling base into an inner portion and an outer portion. The thermal break permits the inner portion and outer portion of the cooling base to be maintained at separate temperatures without thermal smearing across the inner and outer portions. Alternately, the cooling base may be formed of two independent cooling bases; i.e., an inner cooling base and an outer cooling base. The inner cooling base and an outer cooling base permit separate temperatures without thermal smearing.

The inner portion of the cooling base is disposed under the substrate and the outer portion is disposed under the edge ring. The inner portion of the ceramic plate is bonded to an inner portion of the cooling base by a first bond material that accommodates mismatch between coefficients of thermal expansion of the ceramic plate and cooling base. The first bond material has a thermal conductivity between about 0.3 W/mK and about 1.2 W/mK. The outer portion of the ceramic plate is bonded to an outer cooling base by a second bond material. The second bond material has a thermal conductivity greater than about 2.0 W/mK. The greater thermal conductivity of the second bond material drives the heat at the edge ring downward into the outer portion of the cooling base instead of inward to the inner portion of the cooling base disposed below the substrate.

Figure 1:
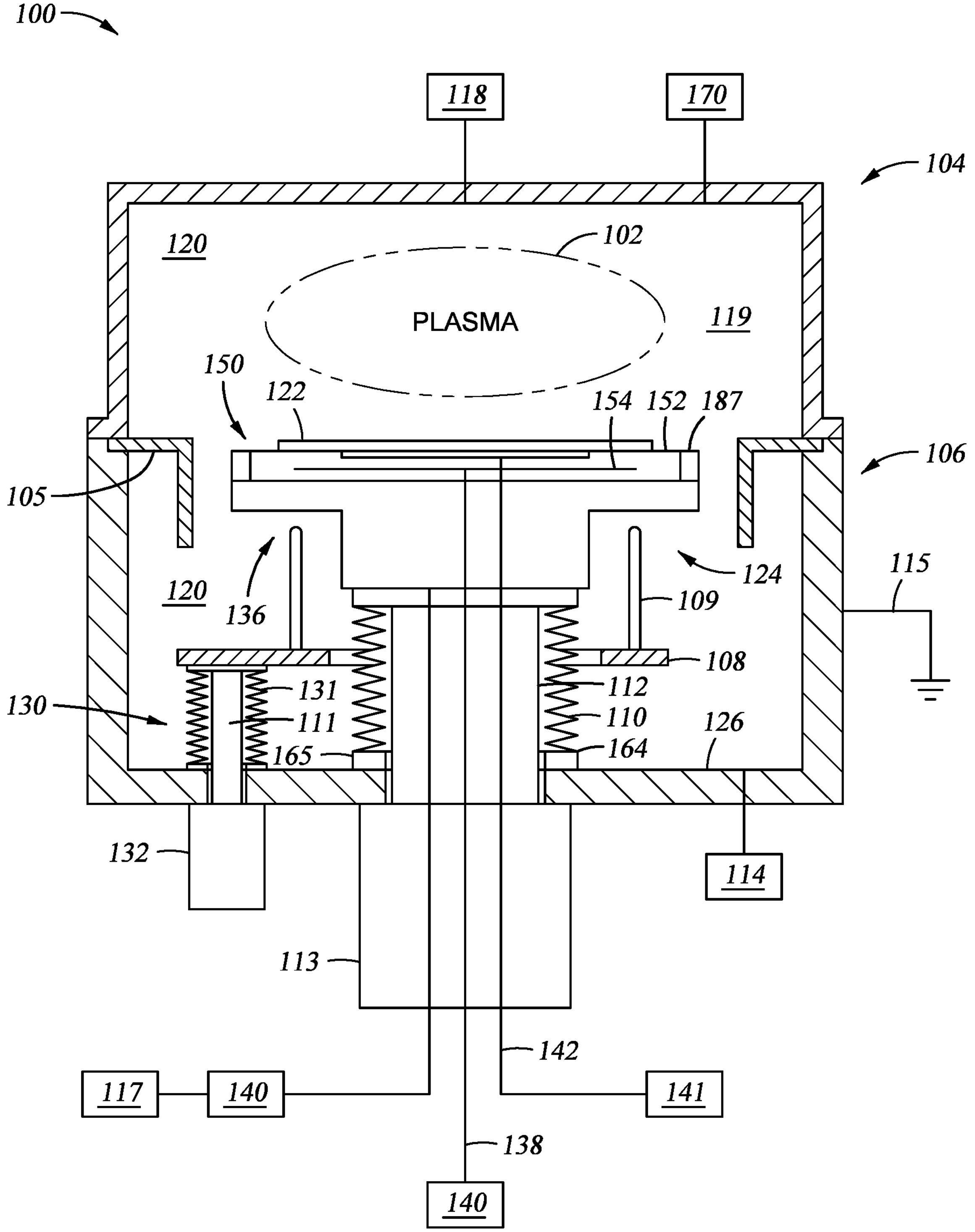
FIG. 1 depicts a schematic side view of a process chamber having a substrate support in accordance with at least some examples of the present disclosure.

FIG. 1 depicts a schematic side view of a plasma processing chamber 100 having a substrate support 124 in accordance with at least some examples of the present disclosure. In some examples, the plasma processing chamber 100 is an etch processing chamber. However, other types of processing chambers configured for different processes can also use or be modified for use with examples of the substrate support 124 described herein.

The plasma processing chamber 100 is a vacuum chamber that is suitably adapted to maintain sub-atmospheric pressures within a chamber interior volume 120 during substrate processing. The plasma processing chamber 100 includes a chamber body 106 covered by a lid 104 which encloses a processing volume 119 located in the upper portion of the chamber interior volume 120 above the substrate support 124. The plasma processing chamber 100 may also include one or more liners 105 circumscribing various chamber components to prevent unwanted reaction between such components and ionized process material. The chamber body 106 and lid 104 may be made of metal, such as aluminum. The chamber body 106 may be grounded via a coupling to ground 115.

The substrate support 124 is disposed within the chamber interior volume 120 to support and retain a substrate 122 thereon, such as a semiconductor wafer. The substrate support 124 may generally comprise an electrostatic chuck assembly 150 (described in more detail below with respect to FIGS. 2-5) and a hollow support shaft 112 for supporting the electrostatic chuck assembly 150. The electrostatic chuck assembly 150 comprises an electrostatic chuck 152 having one or more electrodes 154 disposed therein and a cooling base 136. The electrostatic chuck 152 electrostatically chucks the substrate 122 to the substrate support 124. The hollow support shaft 112 provides a conduit to provide, for example, backside gases, process gases, fluids, coolants, power, or the like, to the substrate support 124.

In some examples, the hollow support shaft 112 is coupled to a lift mechanism 113, such as an actuator or motor, which provides vertical movement of the electrostatic chuck assembly 150 between an upper, processing position (as shown in FIG. 1) and a lower, transfer position (not shown). A bellows assembly 110 is disposed about the hollow support shaft 112 and is coupled between the electrostatic chuck assembly 150 and a bottom surface 126 of plasma processing chamber 100 to provide a flexible seal that allows vertical motion of the electrostatic chuck assembly 150 while preventing loss of vacuum from within the plasma processing chamber 100.

The hollow support shaft 112 provides a conduit for coupling a backside gas supply 141, a chucking power supply 140, and RF sources (e.g., RF plasma power supply 170 and a bias power supply 117) to the electrostatic chuck assembly 150. In some examples, the bias power supply 117 includes one or more RF bias power sources. In some examples, RF energy supplied by the RF plasma power supply 170 may have a frequency of about 40 MHz or greater. The backside gas supply 141 is disposed outside of the chamber body 106 and supplies heat transfer gas to the electrostatic chuck assembly 150. In some examples, a RF plasma power supply 170 and a bias power supply 117 are coupled to the electrostatic chuck assembly 150 via respective RF match networks (only RF match network 116 shown). In some examples, the substrate support 124 may alternatively include AC, DC, or RF bias power.

A substrate lift 130 includes lift pins 109 mounted on a platform 108 connected to a shaft 111 which is coupled to a second lift mechanism 132 for raising and lowering the platform 108 and pins 109 so that the substrate 122 may be placed on or removed from the electrostatic chuck assembly 150. The electrostatic chuck assembly 150 includes through holes to receive the lift pins 109. A bellows assembly 131 is coupled between the substrate lift 130 and bottom surface 126 to provide a flexible seal that maintains the chamber vacuum during vertical motion of the substrate lift 130.

In some examples, the electrostatic chuck assembly 150 includes gas distribution channels extending from a lower surface of the electrostatic chuck assembly 150 (e.g., bottom surface of the cooling base 136) to various openings in an upper surface of the electrostatic chuck assembly 150. Gas distribution channels 138 are configured to provide backside gas, such as nitrogen (N) or helium (He), to the top surface of the electrostatic chuck assembly 150 to act as a heat transfer medium. The gas distribution channels 138 are in fluid communication with the backside gas supply 141 via gas conduit 142 to control the temperature and/or temperature profile of the electrostatic chuck assembly 150 during use.

The plasma processing chamber 100 is coupled to and in fluid communication with a pumping system 114 that includes a throttle valve (not shown) and vacuum pump (not shown) which are used to exhaust the plasma processing chamber 100. The pressure inside the plasma processing chamber 100 may be regulated by adjusting the throttle valve and/or vacuum pump. The plasma processing chamber 100 is also coupled to and in fluid communication with a process gas supply 118 that may supply one or more process gases to the plasma processing chamber 100 for processing the substrate 122 disposed therein.

In operation, a plasma 102 is created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power may also be provided from a bias power supply 117 to the one or more electrodes 154 within the electrostatic chuck assembly 150 to attract ions from the plasma towards the substrate 122.

Figure 2:
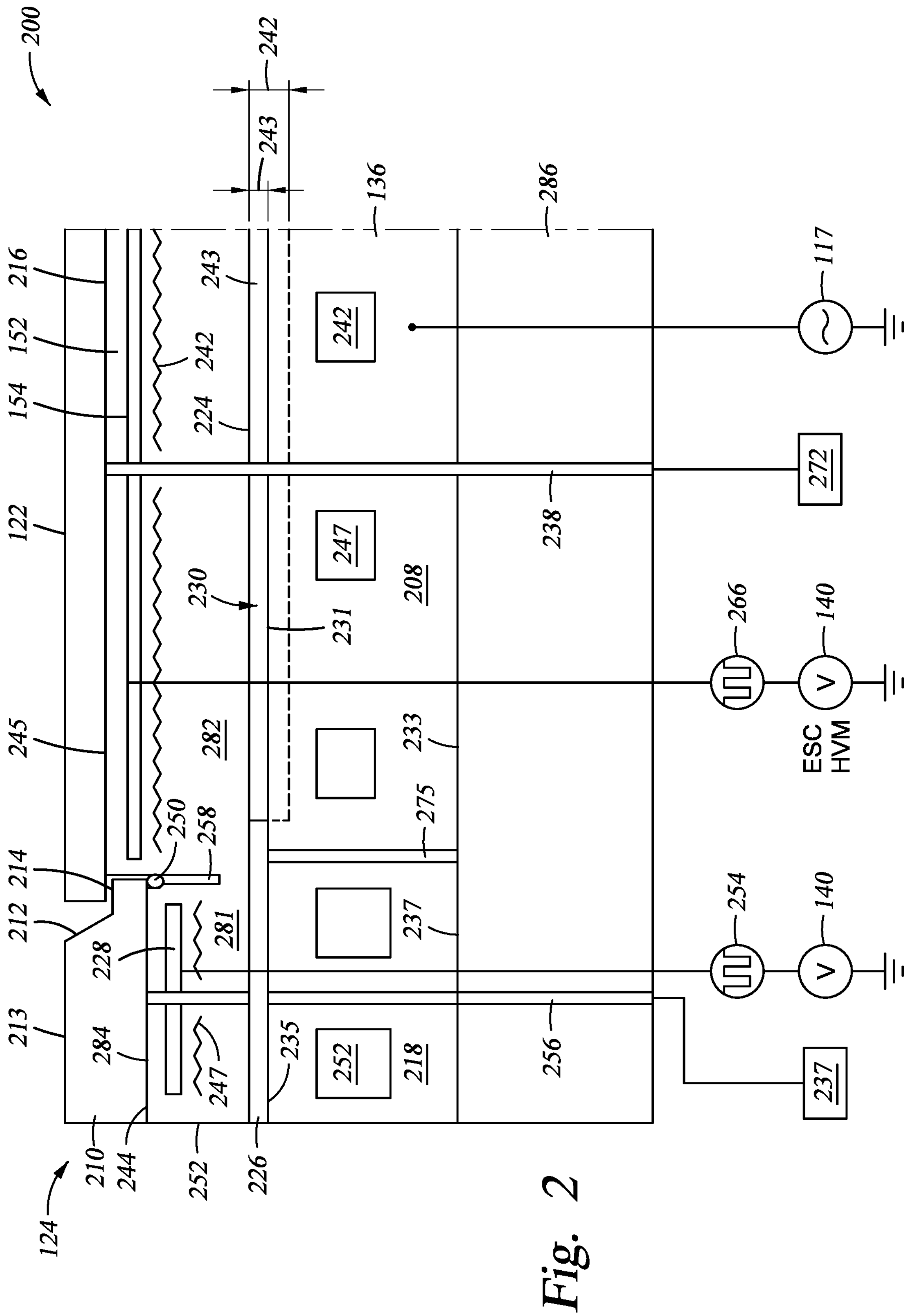
FIG. 2 depicts a schematic partial side view of the substrate support in accordance with one example of the present disclosure.

FIG. 2 depicts a schematic partial side view of the substrate support 124 in accordance with at least one example of the present disclosure. The electrostatic chuck 152 includes a first side 216 configured to support the substrate 122 and a second side 224 opposite the first side 216. The electrostatic chuck 152 has an outer diameter 255. The electrostatic chuck 152 has an inner portion 282 and an outer portion 281 extending to the outer diameter 255 and surrounding the inner portion 282. The electrostatic chuck 152 is fabricated from ceramic, forming a ceramic plate with embedded electrodes.

A thermal break 258 is formed between the outer portion 281 and the inner portion 282. The thermal break 258 extends through the first side 216 splitting the first side 216. The thermal break 258 splits the first side 216 into an inner top surface 245 and an outer top surface 244. The substrate 122 is disposed on the inner top surface 245 and an edge ring 210 is disposed on the outer top surface 244. The thermal break 258 helps maintain temperature independence and prevent temperature migration between the outer portion 281 and the inner portion 282 of the electrostatic chuck 152

A seal 250 is disposed in the thermal break 258 to prevent plasma 102 from eroding portions of the electrostatic chuck 152. Additionally, the seal 250 prevents arcing from between the inner portion 282 and the outer portion 281 of the electrostatic chuck 152. Alternately, the thermal break 258 may be filled with a suitable thermally insulating material, such as silicon.

The electrostatic chuck 152 includes one or more electrodes 154 embedded in the inner portion 282. The electrodes 154, when energized, electrostatically chuck the substrate 122 to the inner top surface 245. The one or more electrodes 154 may be monopolar or bipolar. In some examples, the electrostatic chuck 152 provides Coulombic chucking. In some examples, the electrostatic chuck 152 provides Johnsen-Rahbek chucking. In some examples, the one or more electrodes 154 comprise an upper electrode, a lower electrode (not shown), and a plurality of posts electrically coupled to the upper and lower electrodes. In some examples, the inner portion 282 of the electrostatic chuck 152 additionally includes one or more heating elements 249 embedded therein to control a temperature of the electrostatic chuck 152. In some examples, the electrostatic chuck 152 is made of aluminum nitride (AlN) or aluminum oxide ($Al_2O_3$).

The electrostatic chuck 152 includes one or more electrodes 228 embedded in the outer portion 281. The outer portion 281 of the electrostatic chuck 152 includes the outer top surface 244 opposite the second side 224. In some examples, the electrodes 228 may be monopolar or bipolar. In some examples, the electrodes 228 provides Coulombic chucking. In some examples, the electrodes 228 provides Johnsen-Rahbek chucking. The edge ring 210 is disposed on the outer top surface 244 above the electrodes 228 in the outer portion 281 of the electrostatic chuck 152. The one or more electrodes 228 are coupled to a negative pulsed DC power supply 254 to chuck the edge ring 210 to the electrostatic chuck 152.

The edge ring 210 includes an angled inner surface 212 disposed between an uppermost surface 213 of the edge ring 210 and a second upper surface 214. In some examples, the edge ring 210 is made of silicon (Si). In some examples, at least one of the outer top surface 244 and/or a lower surface 284 of the edge ring 210 is polished to enhance thermal coupling between.

The cooling base 136 includes an inner cooling plate 208 and an outer cooling plate 218. A break 275 may physically and thermally separate the inner cooling plate 208 and the outer cooling plate 218 into two distinctly controlled cooling plates. The inner cooling plate 208 and the outer cooling plate 218 provide dual temperature zones for the cooling base 136. In some examples, the electrostatic chuck 152 is spaced apart by the break 275 from the outer cooling plate 218 to reduce thermal coupling between the electrostatic chuck 152 and the outer cooling plate 218. The break 275 may be an air gap. Alternately, the break 275 may be filled with a thermally insulating or other suitable material. For example, the break 275 may be filled with silicon. In yet another example, the inner cooling plate 208 and the outer cooling plate 218 may be physically in contact with each other.

The inner cooling plate 208 has an upper surface 231 and a lower surface 233. The inner cooling plate 208 includes first coolant channels 242. The first coolant channels 242 are configured to flow a coolant having a first temperature therethrough to cool the inner portion 282 of the electrostatic chuck 152.

The outer cooling plate 218 has an upper surface 235 and a lower surface 237. The outer cooling plate 218 includes second coolant channels 252. The second coolant channels 252 in the outer cooling plate 218 are configured to circulate a coolant having a second temperature therethrough to cool the outer portion 281 of the electrostatic chuck 152. The outer cooling plate 218 can be maintained as a temperature different then the inner cooling plate 208. The temperature differential between the outer cooling plate 218 and the inner cooling plate 208 helps to manage the heat flux to control the edge to center temperature of the electrostatic chuck 152.

The first coolant channels 242 are fluidly independent (i.e. isolated) from the second coolant channels 252. In some examples, a first temperature of a first fluid flowing in the first coolant channels 242 is different (for example cooler or hotter) than a second temperature of a second fluid flowing in the second coolant channels 252. The first coolant channels 242 and the second coolant channels 252 are coupled to one or more chillers configured to recirculate the coolant therethrough. In some examples, the first coolant channels 242 and the second coolant channels 252 are coupled to separate chillers to provide independent temperature control of the different coolants.

The break 275 may vertically align with thermal break 258. In this manner, the outer portion 281 of the electrostatic chuck 152 is disposed directly on the outer cooling plate 218. Heat from the outer portion 281 of the electrostatic chuck 152, prevented from entering the inner portion 282 of the electrostatic chuck 152 by the thermal break 258, is therefore directed downward into the outer cooling plate 218. Thus, the outer cooling plate 218 may directly influence the temperature of the area around the edge ring 210 without influence from the inner cooling plate 208.

In some examples, the bias power supply 117 is electrically coupled to inner cooling plate 208 and the outer cooling plate 218 to create a same bias voltage on the substrate 122 and the edge ring 210. In operation, the bias power supply 117 applied on the cooling base 136 creates a sheath between the substrate 122 and the plasma 102. As a result, ions from the plasma 102 are attracted to the substrate 122 that is biased, and the ions accelerate through the sheath perpendicular to equipotential lines within the sheath. For a minimum impact on the substrate 122 and direct voltage control, the one or more electrodes 228 are coupled to a negative pulsed DC power source 254. When the edge ring 210 erodes over time due to the impact of the ions during processing, a shape of the sheath proximate an edge of the substrate 122 may be adjusted by applying more or less bias power to the edge ring 210 for correcting for non-uniform processing of the substrate 122 that would otherwise be caused by the eroding edge ring 210. The negative pulsed DC power source 254 is configured to provide a power profile to correct sheath bending and maintain a substantially flat sheath profile across the substrate 122. The negative pulsed DC power source 254 may be provided to the edge ring 210 at 50 kHz or higher. In some examples, the one or more electrodes 228 are disposed less than 0.3 mm from a bottom of the edge ring 210 to provide efficient coupling of the negative pulsed DC power source 254 to the edge ring 210.

In some examples, the one or more electrodes 154 of the electrostatic chuck 152 are coupled to a negative pulsed DC power source 266. The negative pulsed DC power source 266 is configured to provide a power profile to correct sheath bending and maintain a substantially flat sheath profile across the substrate 122 independently of the negative pulsed DC power source 254.

The outer portion 281 of the electrostatic chuck 152 may include a heating element 247 embedded therein. The heating element 247 is coupled to a power source (e.g., an AC power source) to power the heating element 247. In some examples, a temperature probe is embedded within or otherwise coupled to the outer portion 281 of the electrostatic chuck 152 to monitor and control a temperature of the outer portion 281 of the electrostatic chuck 152, and used to control the power applied to the heating element 247. In some examples, the chucking electrode 228 is disposed between the outer top surface 244 and the heating element 247.

In some examples, a heating element 249 is embedded in the inner portion 282 of the electrostatic chuck 152 to heat the electrostatic chuck 152 proximate the substrate 122. The heating element 249 may be coupled to the same power source as heating element 247 or another power source.

In some examples, the cooling base 136 is made of an electrically conductive material, for example, aluminum (Al). The outer cooling plate 218 and the inner cooling plate 208 are both coupled to the second side 224 of the electrostatic chuck 152. In some examples, the cooling base 136 rests on an insulator plate 286 of the substrate support 124. In some examples, the insulator plate 286 is made of aluminum oxide ($Al_2O_3$) or polyphenylene sulfide (PPS).

A bonding layer 230 is disposed between the electrostatic chuck 152 and the cooling base 136. The bonding layer 230 is configured to provide improved thermal coupling between the cooling base 136 and the electrostatic chuck 152. The bonding layer 230 includes a first bond material 226 in the outer portion and a second bond material 243 in the inner portion. The first bond material 226 bonds the outer portion 281 of the electrostatic chuck 152 to the upper surface 235 of the outer cooling plate 218. The second bond material 243 bonds the inner portion 282 of the electrostatic chuck 152 to the upper surface 231 of the inner cooling plate 208. An interface where the first bond material 226 contacts the second bond material 243 may not align with a break in the cooling plate 208 or a break in the electrostatic chuck 152. In one example, the interface where the first bond material 226 contacts the second bond material 243 is offset towards the inner portion 282 of the electrostatic chuck 152.

The first bond material 226 has a different thermal conductivity than the second bond material 243. In some examples, the first bond material 226 in the outer portion of the bonding layer 230 comprises a 2K material. The second bond material 243 in the inner portion of the bonding layer 230 comprises a 1K material. In one example, the bond layer 230 is a silicon material. The silicon may have an additive, such as alumina, to adjust the thermal conductivity of the first bond material 226 or the second bond material 243. In this manner, the thermal conductivity of the first bond material 226 may be twice that of the thermal conductivity of the second bond material 243. The higher thermal conductivity of the first bond material 226 encourages the heat to transfer through first bond material 226 preferentially over the second bond material 243.

In some examples, the first bond material 226 of the bonding layer 230 has a thickness of about 0.1 mm to about 0.4 mm. In some examples, the first bond material 226 of the bonding layer 230 has a thermal conductivity of about 2.0 W/mK to about 3.2 W/mK. In some examples, the second bond material 243 in the inner portion of the bonding layer 230 comprises silicone or an epoxy. In some examples, the second bond material 243 of the bonding layer 230 has a thickness of about 0.1 mm to about 0.8 mm. In some examples, the second bond material 243 of the bonding layer 230 has a thermal conductivity of about 0.2 W/mK to about 1.2 W/mK. In some examples, the thickness of the second bond material 243 may be twice the thickness of the first bond material 226. In this manner, the same bond material may be used in the first bond material 226 and the second bond material 243 with the added thickness resulting in a lower thermal conductivity across the thicker portion of the bonding layer 230. Thus, the first bond material 226 has a higher thermal conductivity allowing heat to move through the first bond material 226 more readily than the second bond material 243. By using two or more different materials having the different thermal conductivity in the bonding layer 230, edge temperature roll up; i.e., increase of temperature, at the edge of the substrate 122 can be mitigated by driving heat downward through the first bonding material 226 in the outer portion 281 instead of into the inner portion 282 under the substrate 122.

The gas distribution channels 138 include a first gas channel 238. The first gas channel 238 extends from a bottom of the insulator plate 286, through the inner cooling plate 208 to the inner top surface 245 of the electrostatic chuck 152. The first gas channel 238 provide a first gas to a bottom surface of the substrate 122. The gas distribution channels 138 additionally include a second gas channel 256. The second gas channel 256 extends through the insulator plate 286, the outer cooling plate 218, to the outer top surface 244 of the outer portion 281 of the electrostatic chuck 152. The second gas channel 256 provides a second gas to a bottom surface of the edge ring 210.

The first gas channel 238 and the second gas channel 256 are configured to provide backside gas, such as nitrogen (N) or helium (He), to the top surface of the electrostatic chuck 152 and the bottom surface of the edge ring 210, respectively, to act as a heat transfer medium. In some examples, the first gas channel 238 and the second gas channel 256 are fluidly independent within the substrate support 124 to provide independent temperature control to the substrate 122 and the edge ring 210. For example, the first gas channel 238 may be coupled to a first gas source 272. The second gas channel 256 may be coupled to a second gas source 273. Alternately, the first gas channel 238 and the second gas channel 256 may both be coupled to the backside gas supply 141.

In the example of FIG. 2, the thermal break 258 in the electrostatic chuck 152, along with the higher thermal conductivity of the first bond material 226 in the outer portion of the bonding layer 230, as well as the outer cooling plate 218 thermally separated from the inner portion 282 of the electrostatic chuck 152, all help to drive heat at the edge ring 210 and outer portion 281 of the electrostatic chuck 152 down into the upper surface 235 of the outer cooling plate 218 and not into the inner portion 282 of the electrostatic chuck 152 below the substrate 122. The configuration of the substrate support 124 inhibits excess heat at the edge of electrostatic chuck 152 from being directed under the substrate 122, thus preventing edge temperature roll up and defects.

Figure 3:
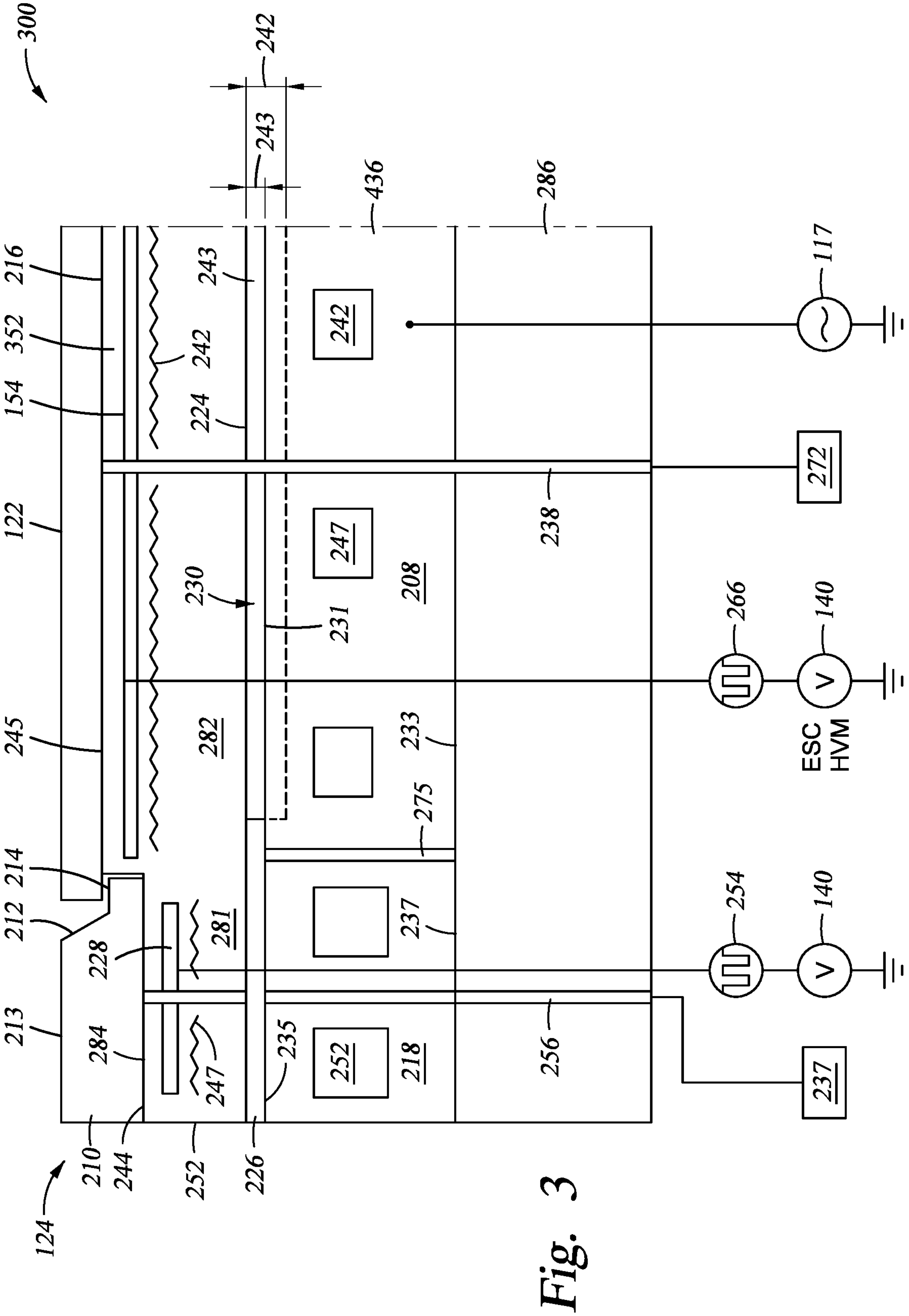
FIG. 3 depicts a schematic partial side view of the substrate support in accordance with another example of the present disclosure.

FIG. 3 depicts a schematic partial side view of a substrate support 300 in accordance with another example of the present disclosure. The substrate support 300 is substantially similar to substrate support 124 and may be used in the plasma processing chamber 100 depicted in FIG. 1. The substrate support 300 shares with substrate support 124 the higher thermal conductivity of the first bond material 226 in the outer portion of the bonding layer 230 to potentially promote heat transfer from the edge ring 210 downward into the outer cooling plate 218 rather than toward the center. The substrate support 300 has an electrostatic chuck 352 that is constructed similar to the electrostatic chuck 152 described above. The electrostatic chuck 352 is without the feature of the thermal break 258 shown in the electrostatic chuck 152 of FIG. 2. The inner and outer regions of the electrostatic chuck 352 are continuous. The electrostatic chuck 352 is simpler to fabricate and operate over the substrate support 124 while providing similar benefits.

Figure 4:
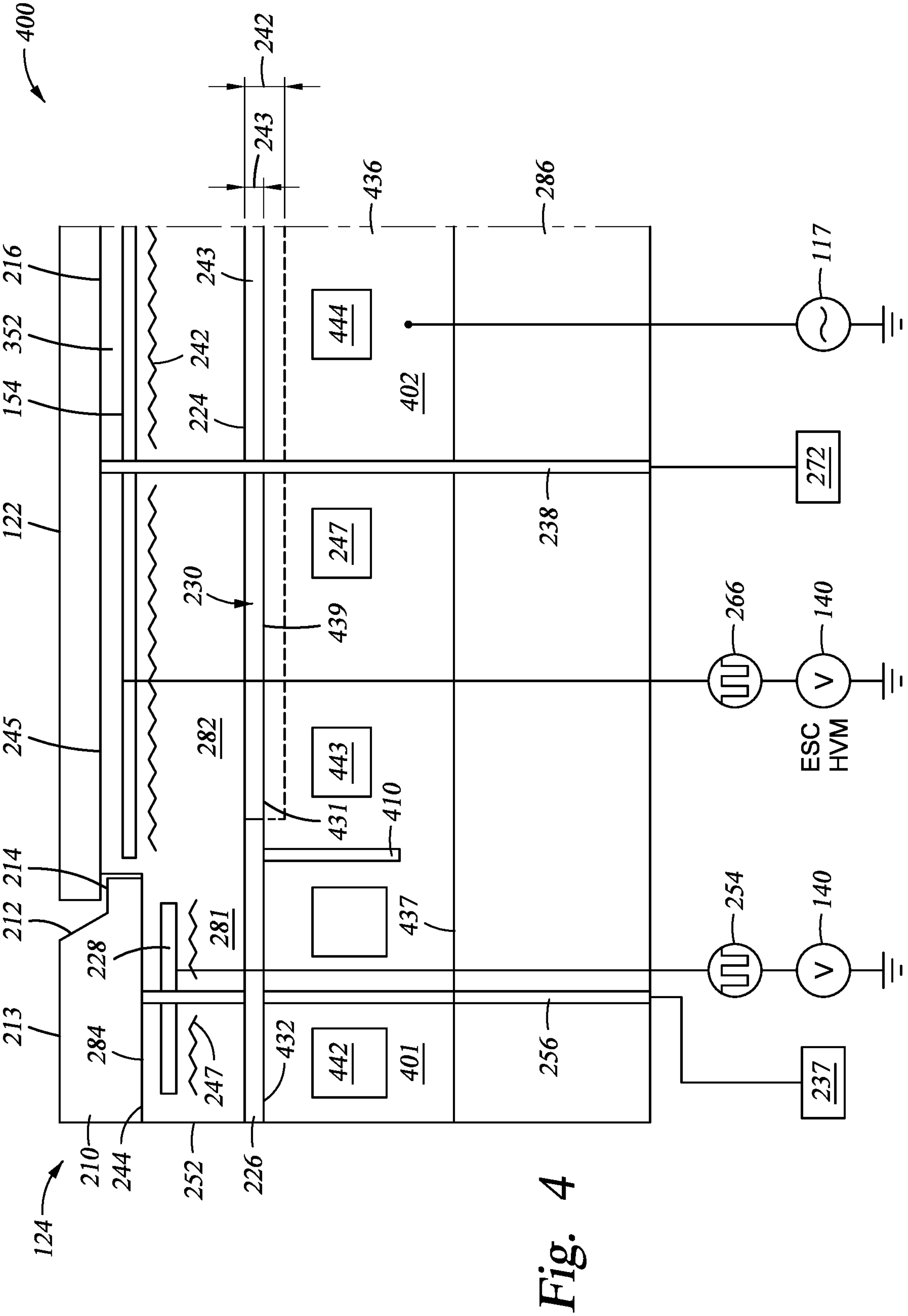
FIG. 4 depicts a schematic partial side view of the substrate support in accordance with yet another example of the present disclosure.

FIG. 4 depicts a schematic partial side view of a substrate support 400 in accordance with yet another example of the present disclosure. The substrate support 400 is substantially similar to substrate support 300 and includes the electrostatic chuck 352 and may be used in the plasma processing chamber 100 depicted in FIG. 1. The substrate support 400 has a cooling base 436. The cooling base 436 has an upper surface 439 and a bottom surface 437. The cooling base 436 has cooling channels 443. The cooling base 436 has a thermal break 410. The thermal break 410 replaces in the same location break 275 of cooling base 136 in substrate support 124.

The thermal break 410 extends from the upper surface 439. Alternatively, the thermal break 410 extends from the bottom surface 437. In one example, the thermal break 410 comprises an annular channel that extends from the upper surface 439 of the cooling base 436 to a location between the upper surface 439 of the cooling base 436 and the bottom surface 437 of the cooling base 436. The thermal break 410 separates the cooling base 436 to form an outer cooling area 401 and an inner cooling area 402 of the cooling base 436. The thermal break 410 splits the upper surface 439 into an outer upper surface 432 in the outer cooling area 401 and an inner upper surface 431 in the inner cooling area 402. The outer cooling area 401 and the inner upper surface 431 share the same bottom surface 437 of the cooling base 436 without a break in the bottom surface 437.

The cooling base 436 has a first coolant channel 442 in the outer cooling area 401 and a second coolant channel 444 in the inner cooling area 402. The first coolant channels 442 and the second coolant channel 444 may be independently controlled. The first coolant channels 442 and the second coolant channel 444 may operate from one or more chillers. For example, the first coolant channels 442 may be fluidly coupled to a first chiller. The second coolant channels 444 may be fluidly coupled to a second chiller. Alternately, the first coolant channels 442 and the second coolant channel 444 may be coupled to the same chiller. The first coolant channels 442 and the second coolant channel 444 increased thermal decoupling between the inner cooling area 402 and the outer cooling area 401.

The substrate support 400 has the electrostatic chuck 352. The substrate support 400 has the higher thermal conductivity of the first bond material 226 in the outer portion of the bonding layer 230 to promote heat transfer from the edge ring 210 downward into the outer cooling area 401 of the cooling base 436. The cooling base 436 is simpler to fabricate and operate over the cooling base 136 shown in substrate support 124 while providing similar benefits.

Figure 5:
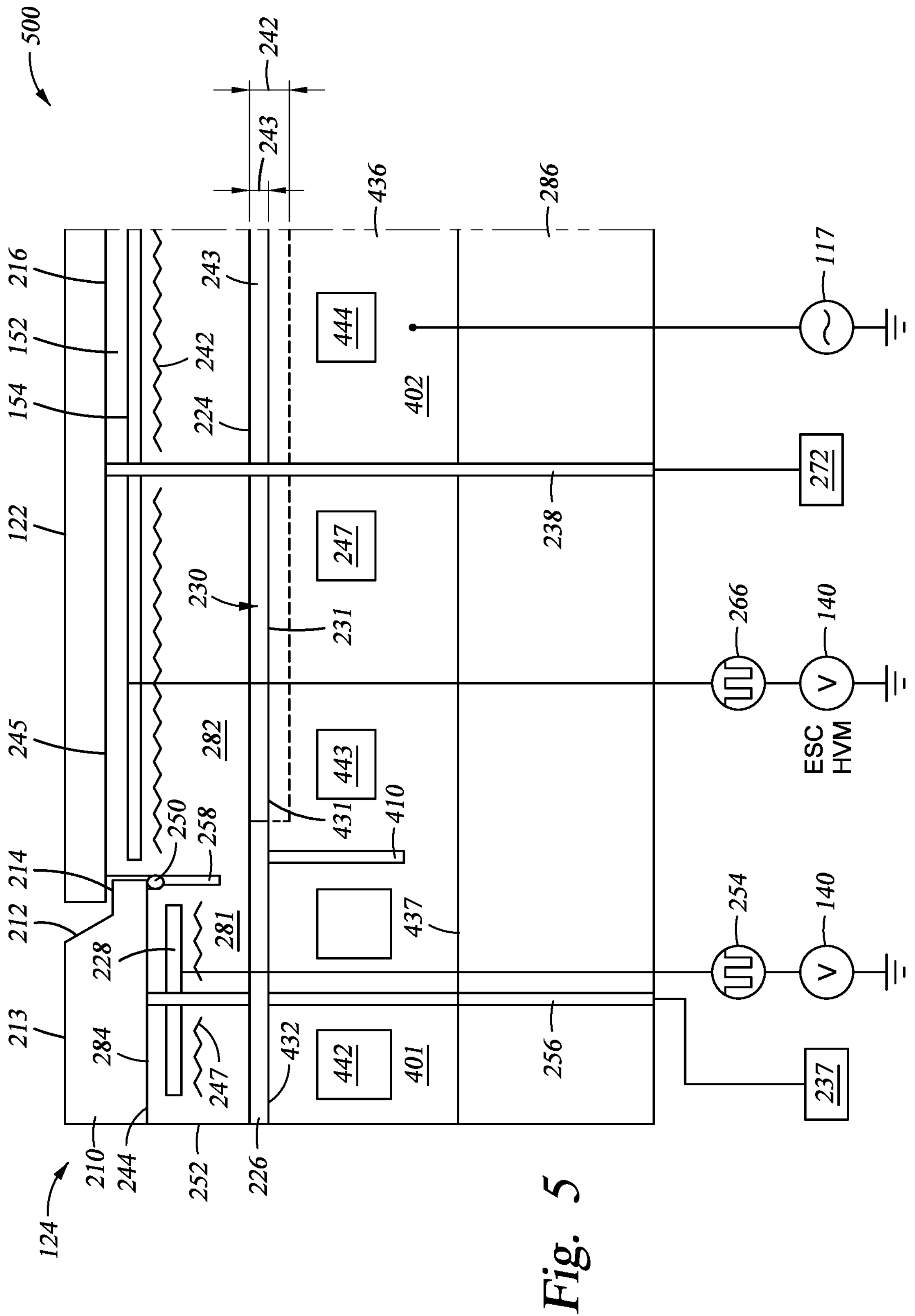
FIG. 5 depicts a schematic partial side view of the substrate support in accordance with and yet another example of the present disclosure.

FIG. 5 depicts a schematic partial side view of a substrate support 500 in accordance with and yet another example of the present disclosure. The substrate support 500 is substantially similar and incorporate the features of the substrate support 400 and the substrate support 124 and may be used in the plasma processing chamber 100 depicted in FIG. 1. In particular, substrate support 500 has the electrostatic chuck 152 of substrate support 124 and the cooling base 436 of substrate support 400. The thermal break 410 in the cooling base 436 vertically aligns with the thermal break 258 in the electrostatic chuck 152. The outer portion of the bonding layer 230 is in contact with and couples the outer portion 281 electrostatic chuck 152 with the outer cooling area 401 of the cooling base 436.

Substrate support 500 relies on the thermal breaks in each of the electrostatic chuck 152 and the cooling base 436 to drive heat downward through the first bond material 226 in the outer portion of the bonding layer 230 to reduce edge temperature roll up at the substrate 122. The substrate support 500 beneficially utilizes the cost savings in the fabrication of the cooling base 436 while enhances the downward thermal conductance with the electrostatic chuck 152.

Advantageously, the substrate support as described above is to be able to tune temperatures in one or more zones to provide the temperature uniformity capable to tune the etch rate while preventing substrate edge temperature roll up. The various backside pressure set points independent of the chamber pressure to better tune temperature control across the substrate, high thermal conductivity of the outer bond material, and the configuration of the outer ceramic plate and cooling base adding capability to control temperature increases along the edge of the substrate and enhance the chamber performance.

While the foregoing is directed to implementations of the present invention, other and further implementations of the invention may be devised without departing from the basic scope thereof, and the scope thereof is determined by the claims that follow.

The invention claimed is:

1. A substrate support assembly for use in a substrate processing chamber, comprising:

a ceramic electrostatic chuck comprising a ceramic plate, the ceramic plate having a first side configured to support a substrate and a second side opposite the first side, wherein the ceramic plate includes an embedded electrode, the first side of the ceramic plate having a raised inner top surface configured to support the substrate and an outer top surface recessed below the raised inner top surface, the outer top surface configured to support an edge ring outward of the substrate;

a cooling base disposed under the second side of the ceramic plate, wherein the cooling base includes an inner portion surrounded by an outer portion; and a bond layer coupling the ceramic plate to the cooling base, wherein the bond layer includes a first bond material and a second bond material, the first bond material disposed in contact with the outer portion of the cooling base and the second side of the ceramic plate directly below the outer top surface, the second bond material disposed in contact with the inner portion of the cooling base and the second side of the ceramic plate directly below the raised inner top surface, and wherein the first bond material has a greater thermal conductivity than that of the second bond material.

2. The substrate support assembly of claim 1, wherein the ceramic plate further comprises:

a thermal break disposed in the ceramic plate separating an outer portion of the ceramic plate and an inner portion of the ceramic plate, the outer portion including the outer top surface and the raised inner portion including the inner top surface.

3. The substrate support assembly of claim 2, wherein the outer portion and the inner portion of the ceramic plate is in contact with the first bond material of the bond layer and only the inner portion of the ceramic plate is in contact with the second bond material of the bond layer.

4. The substrate support assembly of claim 2, wherein the thermal break is filled with a material having a heat transfer coefficient less than a heat transfer coefficient of the ceramic electrostatic chuck.

5. The substrate support assembly of claim 1, wherein the cooling base further comprises:

an inner cooling plate defining the inner portion; and an outer cooling plate defining the outer portion.

6. The substrate support assembly of claim 5, wherein the bond layer over the inner cooling plate is about twice as thick as the bond layer over the outer cooling plate.

7. The substrate support assembly of claim 1, wherein the cooling base further comprises:

a first thermal break, wherein the first thermal break separates the outer portion of the cooling base from the inner portion of the cooling base.

8. The substrate support assembly of claim 7, wherein the ceramic plate further comprises:

a second thermal break disposed in the ceramic plate, wherein the second thermal break is formed between an outer portion of the ceramic plate and an inner portion of the ceramic plate, and wherein the outer portion and the inner portion of the ceramic plate is in contact with the first bond material of the bond layer.

9. The substrate support assembly of claim 1, wherein the second bond material is about twice as thick as the first bond material.

10. A processing chamber, comprising:

a chamber body; and a substrate support assembly disposed within an inner volume of the chamber body, wherein the substrate support assembly comprises:

a ceramic electrostatic chuck comprising a ceramic plate, the ceramic plate having a first side configured to support a substrate and a second side opposite the first side, wherein the ceramic plate includes an embedded electrode, the first side of the ceramic plate having a raised inner top surface configured to support the substrate and an outer top surface recessed below the raised inner top surface, the outer top surface configured to support an edge ring outward of the substrate;

a cooling base disposed under the second side of the ceramic plate, wherein the cooling base includes an inner portion separated from an outer portion; and a bond layer coupling the ceramic plate to the cooling base, wherein the bond layer includes a first bond material and a second bond material, the first bond material disposed in contact with the outer portion of the cooling base and the second side of the ceramic plate directly below the outer top surface, the second bond material disposed in contact with the inner portion of the cooling base and the second side of the ceramic plate directly below the raised inner top surface, and wherein the first bond material has a greater thermal conductivity than that of the second bond material.

11. The processing chamber of claim 10, wherein the ceramic electrostatic chuck further comprises:

a thermal break disposed in the ceramic electrostatic chuck.

12. The processing chamber of claim 11, wherein the thermal break is formed between an outer portion of the ceramic plate and an inner portion of the ceramic plate, and wherein the outer portion and the inner portion of the ceramic plate is in contact with the first bond material of the bond layer and only the inner portion of the ceramic plate is in contact with the second bond material of the bond layer.

13. The processing chamber of claim 12, wherein the thermal break is filled with a material.

14. The processing chamber of claim 10, wherein the cooling base further comprises:

an inner cooling plate in the inner portion; and an outer cooling plate in the outer portion, wherein the inner cooling plate is independently controlled from the outer cooling plate.

15. The processing chamber of claim 14, wherein the bond layer over the inner cooling plate is about twice as thick as the bond layer over the outer cooling plate.

16. The processing chamber of claim 10, wherein the cooling base further comprises:

a thermal break, wherein the thermal break separates the outer portion of the cooling base from the inner portion of the cooling base.

17. The processing chamber of claim 16, wherein the ceramic plate further comprises:

a thermal break disposed in the ceramic electrostatic chuck, wherein the thermal break is formed between an outer portion of the ceramic electrostatic chuck and an inner portion of the ceramic electrostatic chuck, and wherein the inner portion of the ceramic electrostatic chuck is in contact with the first bond material and second bond material of the bond layer.

18. The processing chamber of claim 17, wherein the thermal break in the ceramic plate vertically aligns with thermal break in the cooling base and an interface where the first bond material contacts the second bond material of the bond layer is offset towards a center of the ceramic plate away from the thermal break.

19. The processing chamber of claim 10, wherein the second bond material is about twice as thick as the first bond material.

* * * * *